United States Patent
Yuan

(10) Patent No.: US 11,302,887 B2
(45) Date of Patent: Apr. 12, 2022

(54) ORGANIC ELECTROLUMINESCENT DIODE DEVICE HAVING LIGHT-EMITTING LAYER DISPOSED ON ELECTRON INJECTION LAYER, DISPLAY PANEL, AND MANUFACTURING METHOD THEREOF

(71) Applicant: Shenzhen China Star Optoelectronics Semiconductor Display Technology Co., Ltd., Guangdong (CN)

(72) Inventor: Wei Yuan, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 210 days.

(21) Appl. No.: 16/626,735

(22) PCT Filed: Dec. 18, 2019

(86) PCT No.: PCT/CN2019/126226
§ 371 (c)(1),
(2) Date: Dec. 26, 2019

(87) PCT Pub. No.: WO2021/097981
PCT Pub. Date: May 27, 2021

(65) Prior Publication Data
US 2021/0336192 A1 Oct. 28, 2021

(30) Foreign Application Priority Data
Nov. 22, 2019 (CN) .......................... 201911154101.3

(51) Int. Cl.
*H01L 51/52* (2006.01)
*H01L 27/32* (2006.01)
*H01L 51/56* (2006.01)

(52) U.S. Cl.
CPC ...... *H01L 51/5231* (2013.01); *H01L 27/3248* (2013.01); *H01L 51/5221* (2013.01);
(Continued)

(58) Field of Classification Search
CPC ............. H01L 27/3248; H01L 51/5231; H01L 51/5221; H01L 51/56; H01L 27/3244;
(Continued)

(56) References Cited

U.S. PATENT DOCUMENTS

2004/0135151 A1* 7/2004 Okamoto .......... H01L 29/41733 257/72
2008/0218058 A1* 9/2008 Son ..................... H01L 51/5218 313/500
(Continued)

FOREIGN PATENT DOCUMENTS

CN 103137881 A 6/2013
CN 103165816 A 6/2013
(Continued)

*Primary Examiner* — Michael Jung
(74) *Attorney, Agent, or Firm* — Benesch, Friedlander, Coplan & Aronoff LLP

(57) ABSTRACT

The present invention provides an organic electroluminescent diode device, a display panel, and a manufacturing method thereof. The organic electroluminescent diode device includes a first electrode layer, a conductive layer, an electron injection layer, a light-emitting layer, a hole injection layer, and a second electrode layer, and the conductive layer is provided between the first electrode layer and the electron injection layer.

8 Claims, 1 Drawing Sheet

(52) U.S. Cl.
CPC .......... *H01L 51/56* (2013.01); *H01L 27/3244* (2013.01); *H01L 2227/323* (2013.01); *H01L 2251/5353* (2013.01)

(58) Field of Classification Search
CPC ............. H01L 51/5218; H01L 51/5215; H01L 51/5092
See application file for complete search history.

(56) References Cited

U.S. PATENT DOCUMENTS

| | | | |
|---|---|---|---|
| 2010/0181904 A1* | 7/2010 | Yoshizaki | H01L 51/5228 313/504 |
| 2016/0172628 A1* | 6/2016 | Hashimoto | H01L 51/5076 257/40 |
| 2019/0109292 A1 | 4/2019 | Wang et al. | |
| 2021/0217980 A1* | 7/2021 | Yang | H01L 27/322 |

FOREIGN PATENT DOCUMENTS

| | | | |
|---|---|---|---|
| CN | 103811669 A | 5/2014 | |
| CN | 104201290 A | 12/2014 | |
| CN | 106129263 A | 11/2016 | |
| CN | 106549113 A | 3/2017 | |
| CN | 106784387 A | 5/2017 | |

\* cited by examiner providing the substrate — S10 forming the thin film transistor structure layer — S20 forming the organic electroluminescent diode — S30

ORGANIC ELECTROLUMINESCENT DIODE DEVICE HAVING LIGHT-EMITTING LAYER DISPOSED ON ELECTRON INJECTION LAYER, DISPLAY PANEL, AND MANUFACTURING METHOD THEREOF

BACKGROUND OF INVENTION

Field of Invention

The invention relates to a field of display devices, in particular to an organic electroluminescent diode device, a display panel, and a manufacturing method thereof.

Description of Prior Art

Ink-jet printing an organic light-emitting diode (IJP OLED) is a novel type of display technology, which has physical advantages unmatched by liquid crystal display (LCD) technology, and possesses characteristics such as active light emission, high color reality, infinite contrast, zero delay, transparent display, flexible display, free display form, and so on, and thus is the display technology of next generation that can replace the liquid crystal display technology. The IJP OLED display technology has a structure simpler than LCD since it does not require support by backlight, such that the display product can be made lighter and thinner. Moreover, its working conditions have a series of advantages such as low driving voltage, low energy consumption, and matching with solar cells and integrated circuits. Because the IJP OLED devices are fully solid-state, non-vacuum devices, and have the characteristics of anti-vibration and low temperature resistance (−40° C.), they have a wide range of applications.

In a direction of a large-size panel, in order to meet the needs of a high-resolution 8K display, the IJP OLED structure has changed from a bottom-emitting structure to a top-emitting structure. However, there are still many problems with the currently developed top-emitting IJP OLED structure. One of the most critical issues of the top-emitting IJP OLED structure is that a top electrode is implemented with a thinner cathode material, which usually has a larger resistance, so when conducting current, the panel has a severe voltage drop (IR drop), wherein the larger a size of a panel, the more obvious the IR drop, and since a terminal input voltage is a fixed value, an in-plane voltage will be uneven, resulting in uneven brightness of the panel. A main solution is to increase a number of driver chips and employ a complicated external compensation algorithm to compensate for the uneven brightness of the panel caused by the IR drop. However, how to improve the structure of the OLED device more effectively to eliminate impact of IR drop is a major problem for an OLED panel manufacturer at present.

Meanwhile, due to degradation of the device itself, the IJP OLED structure has a high operating current density when the panel is lit, resulting in a short operating life of the panel. In addition, because the device is degraded, under the same brightness, the operating current must be increased with the time of use, which causes a source voltage of a thin film transistor to increase significantly, resulting in image sticking of the panel. Therefore, how to solve the problem of image sticking is another difficult problem for various OLED device manufacturers.

SUMMARY OF INVENTION

An object of the present invention is to provide an organic electroluminescence diode device, a display panel, and a manufacturing method thereof, in order to solve the problems such as difficulty of electron injection, uneven brightness of a display screen caused by a panel IR drop, image sticking, and so on in the organic electroluminescence diode device of the prior art.

In order to achieve the above object, the present invention provides an organic electroluminescent diode device, which includes a first electrode layer, a conductive layer, an electron injection layer, a light-emitting layer, a hole injection layer, and a second electrode layer.

The conductive layer disposed on the first electrode layer. The electron injection layer disposed on the conductive layer. The light-emitting layer disposed on the electron injection layer. The hole injection layer disposed on the light-emitting layer. The second electrode layer disposed on the hole injection layer.

Further, the organic electroluminescent diode device further includes an electron transport layer and a hole transport layer, wherein the electron transport layer is disposed between the electron injection layer, and the light-emitting layer hole transport layer is disposed between the hole injection layer and the light-emitting layer.

Further, the organic electroluminescent diode device further includes a light-coupling layer disposed on a surface of the second electrode layer away from the hole injection layer.

Further, the first electrode layer includes a first conductive layer, a second conductive layer, and a reflective electrode layer, wherein the first conductive layer; the second conductive layer disposed on the first conductive layer; and the reflective electrode layer disposed between the first conductive layer and the second conductive layer.

Further, the first conductive layer and the second conductive layer are made of indium tin oxide; and the reflective electrode layer is made of metal.

Further, the conductive layer is made of a material including a metal, an alloy, and a metal nanowire.

The present invention also provides a display panel including a substrate, a thin film transistor structure layer, and the organic electroluminescence diode device, wherein the thin film transistor structure layer is disposed on the substrate, and the organic electroluminescent diode device is disposed on a surface of the thin film transistor structure layer away from the substrate.

The invention further provides a method of manufacturing a display panel, including the following steps: providing the substrate; forming the thin film transistor structure layer on the substrate; and forming the organic electroluminescent diode on the thin film transistor structure layer.

Further, the step of forming the organic electroluminescent diode on the thin film transistor structure layer includes the following steps: forming the first electrode layer in the thin film transistor structure layer; forming the conductive layer on the first electrode layer by evaporation coating or inkjet printing; forming the electron injection layer, an electron transport layer, the light-emitting layer, a hole transport layer, and the hole injection layer on the conductive layer sequentially by inkjet printing; and forming the second electrode layer and the light-coupling layer on the hole injection layer and the thin film transistor structure layer by sputtering or evaporation coating.

The present invention also provides a display device including the display panel as described above.

An advantage of the present invention is that an organic electroluminescent diode device and a display panel of the present invention can effectively reduce a potential gap between the first electrode layer and the electron injection layer by adding a conductive layer between a first electrode layer and an electron injection layer of the organic electroluminescent diode device, thereby increasing an effect of electron injection. In addition, the organic light-emitting diode device in the present invention is an inverted OLED device, which is not impacted by the degraded characteristics of the OLED, so that the display panel does not have the problem of image sticking, and can thereby solve the problem of uneven brightness caused by the IR drop of the panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figures 1, 2:
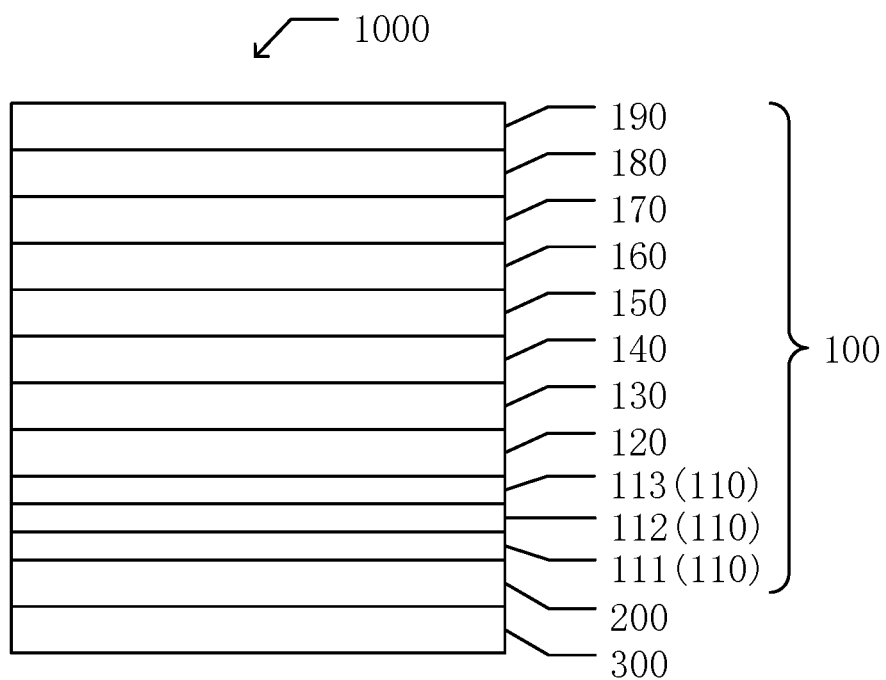
FIG. 1 is a schematic diagram of a layered structure of a display panel according to an embodiment of the present invention.
FIG. 2 is a schematic flowchart of a manufacturing method according to an embodiment of the present invention.

Elements in the drawings are designated by reference numerals listed below.
organic electroluminescent diode device 100;
first electrode layer 110; first conductive layer 111;
reflective electrode layer 112; second conductive layer 113;
conductive layer 120; electron injection layer 130;
electron transport layer 140; light-emitting layer 150;
hole transport layer 160; hole injection layer 170;
second electrode layer 180; light-coupling layer 190;
display panel 1000; thin film transistor structure layer 200;
substrate 300.

DETAILED DESCRIPTION OF PREFERRED EMBODIMENTS

The preferred embodiments of the present invention are described below with reference to the accompanying drawings, which are configured to exemplify the embodiments of the present invention, which can fully describe the technical contents of the present invention to make the technical content of the present invention clearer and easy to understand. However, the present invention may be embodied in many different forms of embodiments, and the scope of the present invention is not limited to the embodiments set forth herein.

In the drawings, the spatially relative terms are intended to encompass different orientations in addition to the orientation as depicted in the figures. Moreover, the size and thickness of each component shown in the drawings are arbitrarily shown for ease of understanding and description, and the invention does not limit the size and thickness of each component. In order to make the illustration clearer, the thickness of components is exaggerated in some positions of the drawings.

The following description of the various embodiments is provided to illustrate the specific embodiments of the invention. Directional terminology mentioned in the present invention, such as "vertical", "horizontal", "upper", "bottom", "pre", "post", "left", "right", "inside", "outside", "side", etc., only refer to the direction of the additional drawing. Therefore, the directional terminology is configured to better and more clearly explain and understand the present invention, rather than to indicate or imply that the device or element referred to must have a specific orientation, or must be constructed and operated in a specific orientation, and thus the directional terminology cannot be construed as limiting the present invention. In addition, the terms "first", "second", "third", etc. are used for descriptive purposes only and should not be construed to indicate or imply relative importance.

When a component is described as "on" another component, the components are formed in direct contact, and may also include embodiments in which additional features may be formed interposing the first and second features, such that the first and second features may not be in direct contact. When a component is described as "installed to" or "connected to" another component, it can be understood that a component is "directly installed" or "directly connected" to another component, or a component is "installed to" or "connected with" another component through an intermediate component.

An embodiment of the present invention provides an organic electroluminescent diode device 100. As shown in FIG. 1, the organic electroluminescent diode device 100 includes a first electrode layer 110, a conductive layer 120, an electron injection layer 130, and an electron transport layer 140, a light-emitting layer 150, a hole transport layer 160, a hole injection layer 170, a second electrode layer 180, and a light-coupling layer 190.

The first electrode layer 110 is disposed on the substrate 300. The first electrode layer 110 is a total reflection electrode and includes a first conductive layer 111, a reflective electrode layer 112, and a second conductive layer 113. The first conductive layer 111 is provided on the substrate 300, the reflective electrode layer 112 is provided on a surface of the first conductive layer 111 away from the substrate 300, and the second conductive layer 113 is provided on the substrate 300. The reflective electrode layer 112 is located on a surface away from the first conductive layer 111. The first conductive layer 111 and the second conductive layer 113 are made of indium tin oxide (ITO), and have thicknesses of 50-700 Å. The reflective electrode layer is made of a highly stable and reflective conductive metal, such as silver, aluminum, gold, platinum, copper, molybdenum, titanium, and the like. The first conductive layer 111 and the second conductive layer 113 are configured to transmit current, and the reflective electrode layer 112 has the function of reflecting light while transmitting the current.

The conductive layer 120 is disposed on a surface of the first electrode layer 110 away from the substrate 300. The conductive layer 120 is made of a metal, an alloy, or a metal nanowire with excellent conductivity, such as conductive metals or alloys of silver, aluminum, gold, platinum, copper, molybdenum, titanium, and the like. The conductive layer 120 has a thickness ranging from 5 to 500 Å, which can be prepared by inkjet printing or evaporation coating. The conductive layer 120 can effectively reduce the potential gap between the first electrode layer 110 and the organic electron injection material, and improve the effect of electron injection.

The electron injection layer 130 is disposed on a surface of the conductive layer 120 away from the first electrode layer 110. The electron injection layer 130 is made of an inorganic material with a lower vacuum energy level or an organic material with a lower lowest unoccupied molecular orbital (LUMO), such as alkali metal oxides, alkaline earth metal oxides, alkali metal carbonates, alkaline earth metal carbonates, alkali metal fluorides, alkaline earth metal fluorides, Alkaline earth metal hydroxide, and alkali metal hydroxide. Specific examples include zinc oxide, lithium fluoride, (8-hydroxyquinoline)-lithium, calcium fluoride, magnesium fluoride, sodium fluoride, potassium fluoride, fluorine barium chloride, cesium fluoride, cesium hydroxide, cesium carbonate, zinc magnesium oxide, and so on. The electron injection layer 130 is configured to inject electrons into the light-emitting layer 150.

The electron transport layer 140 is disposed on a surface of the electron injection layer 130 away from the conductive layer 120, and is made of an organic material. The electron transport layer 140 has an electron carrier transport function, and is configured to transport electrons in the electron injection layer 130 into the light-emitting layer 150.

The light-emitting layer 150 is disposed on a surface of the electron-transport layer 140 away from the electron-injecting layer 130. The light-emitting layer 150 is made of a material including a fluorescent material. The light-emitting layer 150 may emit one of red light, green light, and blue light. The organic electroluminescent diode device 100 realizes self-emission through the light-emitting layer 150.

The hole transport layer 160 is disposed on a surface of the light-emitting layer 150 away from the electron transport layer 140 and is made of an organic material. The hole transport layer 160 has a hole carrier transport function, and is configured to transport holes in the hole injection layer 170 into the light-emitting layer 150.

The hole injection layer 170 is disposed on a surface of the hole transport layer 160 away from the light-emitting layer 150 and is made of an organic material. The hole injection layer 170 is configured to inject holes into the light-emitting layer 150.

The second electrode layer 180 is disposed on a surface of the hole injection layer 170 away from the hole transport layer 160, and is made of a material including one or more of a metal with excellent conductivity and a transparent conductive oxide (TCO), such as indium zinc oxide (IZO), indium tin oxide (ITO), etc.

The light-coupling layer 190 is disposed on a surface of the second electrode layer 180 away from the hole injection layer 170. The light-coupling layer 190 includes the light-coupling output material, which is configured to subject the light emitted from the light-emitting layer 150 to a light-coupling process.

The electrons in the first electrode layer 110 and the holes in the second electrode layer 180 pass through the electron injection layer 130, the electron transport layer 140, the hole injection layer 170, and the hole transport layer 160 respectively under the effect of current and voltage, to converge in the light-emitting layer 150 for combination, so as to excite the fluorescent material in the light-emitting layer 150 to emit light, thereby achieving screen display.

An embodiment of the present invention provides a display panel 1000. As shown in FIG. 1, the display panel 1000 includes a substrate 300, a thin film transistor structure layer 200, and the organic electroluminescent diode device 100 as described above.

The substrate 300 may be a glass substrate 300 or a flexible polyimide substrate 300, and the substrate 300 is configured to protect the overall structure of the display panel 1000. The thin film transistor structure layer 200 is disposed on the substrate 300. The thin film transistor structure layer 200 may be one or more of thin film transistor structures of low temperature polysilicon, metal oxides, amorphous silicon, and so on. The thin film transistor structure layer 200 is configured to control the light emission of the organic electroluminescent diode device 100 and provide power to the organic electroluminescent diode device 100. The organic electroluminescent diode device 100 is provided on a surface of the thin film transistor structure layer 200 away from the substrate 300, and the first electrode layer 110 in the organic electroluminescent diode device 100 is electrically connected to the thin film transistor structure layer 200.

An embodiment of the present invention also provides a method of manufacturing the display panel 1000, as shown in FIG. 2, which includes the following steps:

Step S10) providing the substrate 300, wherein the substrate 300 may be one of insulating substrates such as a glass substrate 300 or a flexible polyimide substrate 300.

Step S20) forming a thin film transistor structure layer 200: sequentially preparing devices in the thin film transistor structure layer 200 to form the thin film transistor structure layer 200 on the substrate 300.

Step S30) forming the organic electroluminescence diode device 100: forming the first electrode layer 110 in the thin film transistor structure by processes such as sputtering, photoresist coating, exposure, development, photoresist stripping, etc. A conductive material 120 with a thickness of 2 nm is prepared on the first electrode layer 110 by evaporation coating or inkjet printing to form the conductive layer 120. An electron injection layer 130 having a thickness of 10 nm, an electron-transport layer 140 having a thickness of 20 nm, a light-emitting layer 150 having a thickness of 40 nm, a hole-transport layer 160 having a thickness of 20 nm, and a hole injection layer 170 having a thickness of 15 nm are sequentially formed on the conductive layer 120 by inkjet printing, wherein the material of the electron injection layer 130 is zinc oxide, the material of the electron transport layer 140 is TAZ, the material of the light-emitting layer 150 is 3,7-di-tert-butylcarbazole doped with PtOEP (by a mass ratio of 20%), the material of the hole transport layer 160 is TFB, and the material of the hole injection layer 170 is HATCN. A magnesium-silver alloy (mass ratio of 1:9) having a thickness of 15 nm is prepared on the hole injection layer 170 by sputtering or evaporation coating to form the second electrode layer 180. A TcTa material layer having a thickness of 60 nm is prepared on the second electrode layer 180 by sputtering or evaporation coating to form the light-coupling layer 190. As a result, the organic electroluminescent diode device 100 is formed.

An embodiment of the present invention provides a display device including the display panel 1000. The display device may be any product or component having a display function, such as a liquid crystal display, a mobile phone, a tablet computer, a notebook computer, a digital camera, a navigator, and the like.

The organic electroluminescent diode device 100 provided in the embodiment of the present invention is an inverted OLED device, which can increase the utilization rate of organic materials and effectively reduce the manufacturing cost of the panel. In addition, by adding a conductive layer 120 on a first electrode layer 110, a potential gap between the first electrode layer 110 and the electron injection layer 130 can be effectively reduced, and the effect of electron injection can be effectively increased. In addition, the inverted organic electroluminescent diode device 100 is not impacted by the degraded characteristics when driving a gate-source voltage in the thin film transistor, and a drain current is only related to the gate voltage, which can effectively solve the problem of image sticking. Meanwhile, since the organic electroluminescent diode device 100 is an inverted type, its second electrode layer 180 is connected to the drain in the thin film transistor structure layer 200, and when conducting current, the IR drop caused by the resistance of the second electrode layer 180 only affects the drain voltage, but the drain voltage is in an electrical saturation region in the thin film transistor structure layer 200. The gate-source voltage is defined by the data input voltage minus the source voltage, so the change of the source voltage has little influence on the gate-source voltage, that is, the change of the drain voltage has little influence on the drain current, and in this way, the brightness of different positions in the panel can be displayed uniformly, which can effectively solve the problem of uneven brightness caused by the IR drop of panel.

Although the present invention is described herein with reference to specific embodiments, it should be understood that these embodiments are merely examples of the principles and applications of the present invention. It should therefore be understood that many modifications can be made to the exemplary embodiments and other arrangements can be devised without departing from the spirit and scope of the invention as defined by the appended claims. Further, it should be understood that different dependent claims and features described herein may be combined in a manner different from that described in the original claims. It can also be understood that combinations between features described in separate embodiments may be used in other described embodiments.

What is claimed is:

1. An organic electroluminescent diode device, comprising:
   a first electrode layer;
   a conductive layer disposed on the first electrode layer;
   an electron injection layer disposed on the conductive layer;
   a light-emitting layer disposed on the electron injection layer;
   a hole injection layer disposed on the light-emitting layer; and
   a second electrode layer disposed on the hole injection layer,
   wherein the first electrode layer comprises: a first conductive layer; a second conductive layer disposed on the first conductive layer; and a reflective electrode layer disposed between the first conductive layer and the second conductive layer.

2. The organic electroluminescent diode device according to claim 1, further comprising:
   an electron transport layer disposed between the electron injection layer and the light-emitting layer; and
   a hole transport layer disposed between the hole injection layer and the light-emitting layer.

3. The organic electroluminescent diode device according to claim 1, further comprising:
   a light-coupling layer disposed on a surface of the second electrode layer away from the hole injection layer.

4. The organic electroluminescent diode device according to claim 1, wherein
   the first conductive layer and the second conductive layer are made of indium tin oxide; and
   the reflective electrode layer is made of metal.

5. The organic electroluminescent diode device according to claim 1, wherein the conductive layer is made of a material comprising a metal, an alloy, and a metal nanowire.

6. A display panel comprising:
   a substrate;
   a thin film transistor structure layer disposed on the substrate; and
   the organic electroluminescence diode device according to claim 1, disposed on the thin film transistor structure layer.

7. A method of manufacturing the display panel according to claim 6, comprising the following steps:
   providing the substrate;
   forming the thin film transistor structure layer on the substrate; and
   forming the organic electroluminescent diode on the thin film transistor structure layer,
   wherein the step of forming the organic electroluminescent diode on the thin film transistor structure layer comprises the following steps:
   forming the first electrode layer in the thin film transistor structure layer;
   forming the conductive layer on the first electrode layer by evaporation coating or inkjet printing;
   forming the electron injection layer, an electron transport layer, the light-emitting layer, a hole transport layer, and the hole injection layer on the conductive layer sequentially by inkjet printing; and
   forming the second electrode layer and the light-coupling layer on the hole injection layer and the thin film transistor structure layer by sputtering or evaporation coating.

8. A display device, comprising the display panel according to claim 6.

* * * * *